(12) United States Patent
Daugela

(10) Patent No.: US 10,274,630 B2
(45) Date of Patent: Apr. 30, 2019

(54) TRAMP METAL DETECTION

(71) Applicant: Syncrude Canada Ltd. in trust for the owners of the Syncrude Project as such owners exist now and in the future, Fort McMurray (CA)

(72) Inventor: Darcy Daugela, Edmonton (CA)

(73) Assignee: SYNCRUDE CANADA LTD. in trust for the owners of the Syncrude Project as such owners exist now and in the future, Fort McMurray (CA)

( * ) Notice: Subject to any disclaimer, the term of this patent is extended or adjusted under 35 U.S.C. 154(b) by 25 days.

(21) Appl. No.: 15/170,474

(22) Filed: Jun. 1, 2016

(65) Prior Publication Data

US 2017/0031049 A1 Feb. 2, 2017

Related U.S. Application Data

(60) Provisional application No. 62/169,954, filed on Jun. 2, 2015.

(51) Int. Cl.
*G01R 33/02* (2006.01)
*G01V 3/08* (2006.01)
*G01R 33/00* (2006.01)
*G01R 33/12* (2006.01)

(52) U.S. Cl.
CPC .......... *G01V 3/081* (2013.01); *G01R 33/0029* (2013.01); *G01R 33/12* (2013.01)

(58) Field of Classification Search
CPC .......... G01V 3/081; G01V 3/10; G01R 33/12; G01R 33/0029; G01R 33/025
See application file for complete search history.

(56) References Cited

U.S. PATENT DOCUMENTS

| 2,315,045 | A |   | 3/1943  | Breitenstein |            |
|-----------|---|---|---------|--------------|------------|
| 3,889,249 | A | * | 6/1975  | Bennett, Jr. | G01V 3/107 |
|           |   |   |         |              | 307/116    |
| 3,964,042 | A | * | 6/1976  | Garrott      | G01V 3/08  |
|           |   |   |         |              | 324/239    |
| 3,972,156 | A | * | 8/1976  | Bennett, Jr. | G01V 3/08  |
|           |   |   |         |              | 324/243    |
| 4,344,074 | A | * | 8/1982  | Strosser     | G01V 3/08  |
|           |   |   |         |              | 324/232    |
| 4,854,113 | A |   | 8/1989  | Strosser et al. |         |
| 5,432,445 | A | * | 7/1995  | Dinsmore     | G01R 33/04 |
|           |   |   |         |              | 324/253    |
| 5,572,121 | A |   | 11/1996 | Beswick      |            |

(Continued)

FOREIGN PATENT DOCUMENTS

| CA | 1122669 A  | 4/1982 |
| CA | 2178332 A1 | 4/1996 |

(Continued)

*Primary Examiner* — Minh N Tang
(74) *Attorney, Agent, or Firm* — Bennett Jones LLP

(57) ABSTRACT

A system for detecting and discriminating a metal object in a bulk non-metallic material includes at least one triple-axis magnetometer adapted to detect a change of a magnetic field and output a signal including a detection signal representative of a metal object and a signal processing system adapted to detect the detection signal. The bulk non-metallic may be continuously moving through a detection volume, or may be placed in and removed from the detection volume as a batch.

30 Claims, 5 Drawing Sheets

(56) References Cited

U.S. PATENT DOCUMENTS

| 7,919,964 B2* | 4/2011 | Bosnar | G01V 11/00 324/239 |
|---|---|---|---|
| 2010/0315080 A1* | 12/2010 | Duncan | G01V 3/104 324/258 |

FOREIGN PATENT DOCUMENTS

| GB | 1343556 A | 1/1974 |
|---|---|---|
| GB | 1452549 A | 10/1976 |
| JP | 2005337996 A | 12/2005 |
| WO | WO 1997/050000 A2 | 12/1997 |
| WO | WO 2008/112937 A2 | 9/2008 |
| WO | WO 2016/090412 A1 | 6/2016 |

* cited by examiner

TRAMP METAL DETECTION

CROSS-REFERENCE TO RELATED APPLICATIONS

This application claims priority to U.S. Provisional Patent Application No. 62/169,954, the entire contents of which is incorporated herein by reference.

FIELD OF THE INVENTION

The present invention relates to systems and methods for tramp metal detection and discrimination in a mining operation.

BACKGROUND

Oil sand containing bitumen mined from the ground is generally slurried with water as part of an initial process for eventually removing the bitumen from the oil sand. Oil sand is a type of bitumen deposit typically containing sand, water and bitumen. When the oil sand deposit is located relatively close below the ground surface, the oil sand is often extracted from the deposit by excavating down through the ground surface to where the oil sand deposit occurs and removing oil sand from the deposit with heavy machinery.

Typically, this removal of the oil sand from the deposit is done with large power shovels and dump trucks, with the power shovels removing shovel-loads of oil sand from the deposit and loading the collected oil sand into dump trucks, which load the oil sand onto conveyors to be carried away for further processing.

Tramp metal inclusions in mined oil sand may pose a problem in slurry preparation methods, particularly in screen-less slurry preparation towers. Tramp metal is often a piece of metal from machinery used earlier in the process, such as a piece of shovel tooth from the power shovel or a piece of crusher tooth from the primary crusher. Large pieces of tramp metal may damage or jam one of the roll crushers used in the slurry preparation tower when it is fed into the slurry preparation tower along with a portion of oil sand. This may result in the entire process being stopped while the crusher rolls are either repaired or the jam is located and the tramp metal removed. This may lead to lengthy outages to remove the object from the crusher rolls and affect repairs if any damage has occurred.

Screening processes typically remove tramp metal through the screening apparatus, however, with screen-less slurry preparation processes, it may be desirable to detect and remove the tramp metal prior to crushing in the slurry preparation tower to avoid such outages.

Many metal detection methods are well known. Magnetic pulse induction methods are typically used for detecting metal objects because it generates a strong signal, and both ferrous and non-ferrous metals can be discriminated. Typically this method first generates a large magnetic pulse, and then measures the decay of magnetic fields generated by currents induced in metal objects by the first pulse. Various techniques, including balanced coils, are often used to cancel out the background signal so only changes are detected. In environments containing a significant amount of metal, background noise from that metal is a large component of the detected signal and background subtraction is less effective as the desired signal becomes lost in the noise. This is especially true in industrial environments where background metal may vibrate, or change configuration.

SUMMARY OF THE INVENTION

In embodiments of the present invention, magnetic field anomalies produced are used to detect and discriminate metal objects in environments containing significant background metal.

In one aspect, the invention may comprise a system for detecting and discriminating a metal object contained in a bulk of non-metallic material, comprising:
(a) at least one triple-axis magnetometer disposed adjacent a detection volume and adapted to detect a change in strength and/or direction of a magnetic field and output a signal; and
(b) a signal processing system adapted to detect a signal representative of a metal object by removing noise components of the output signal.

The magnetic field is preferably a static or slowly changing magnetic field.

In another aspect, the invention may comprise a method of detecting a metal object in a bulk of non-metallic material, comprising the step of positioning at least one triple-axis magnetometer adapted to detect a change in a magnetic field in a detection volume containing the bulk material, detecting a change in the magnetic field, and outputting a signal comprising a detection signal representative of a metal object.

In another aspect, the invention may comprise a method for detecting and discriminating metal objects that have entered or left a detection volume which is contained in or associated with an environment having metal components, such as a holding tank, can, barrel, truck box, conveyor or apron feeder. The method comprises the step of identifying a magnetic anomaly in a magnetic field in the detection volume caused by the metal object. In one embodiment, the metal object may be contained in a bulk non-metal material which is continuously moving through the detection volume. In another embodiment, the metal object may be contained in a bulk non-metal material which is placed and removed in the detection volume as a batch.

BRIEF DESCRIPTION OF THE DRAWINGS

The following drawings form part of the specification and are included to further demonstrate certain embodiments or various aspects of the invention. In some instances, embodiments of the invention can be best understood by referring to the accompanying drawings in combination with the detailed description presented herein. The description and accompanying drawings may highlight a certain specific example, or a certain aspect of the invention. However, one skilled in the art will understand that portions of the example or aspect may be used in combination with other examples or aspects of the invention.

DETAILED DESCRIPTION

Figure 1:
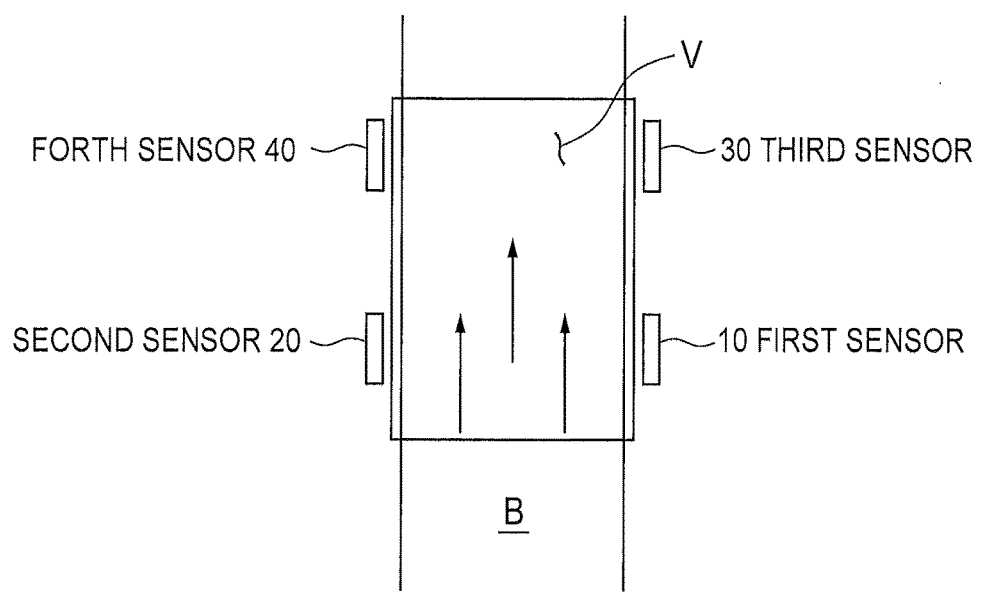
FIG. 1 is a schematic in top plan view of one embodiment of the present invention, positioned adjacent a conveyor belt.

As used herein, the recited terms have the following meanings. All other terms and phrases used in this specification have their ordinary meanings as one of skill in the art would understand. As used herein, a "metal object" comprises a ferrous or non-ferrous metal material which alters or may be caused to alter a magnetic field, which alteration may be detected or sensed by a magnetometer. Tramp metal includes metal objects which are debris from damaged or broken equipment or machinery, such as shovel teeth or the like.

The present invention relates to a system and method for detecting a metal object in non-metallic bulk material. In particular, the present invention may be used in an oil sand mining operation, to detect metal objects in a bulk volume of oil sand ore. Embodiments of the present invention utilize well known magnetic field detection sensors comprising magnetometers, which measure the strength of a magnetic field. A three-axis magnetometer comprises three magnetometers arrayed in orthogonal planes, enabling the detection of the strength and direction of a magnetic field at a point in space.

Embodiments of the invention may be used in an environment having moving, rotating or vibrating metal parts, metal containment walls or other significant metal components. Non-limiting examples of such environments include a holding tank, can, barrel, truck box, conveyor or apron feeder.

In methods of the present invention adapted for use where the bulk material which may contain a metal object is moving through the detection volume, metal objection detection may rely on the principle that a metal object in a static magnetic field, or a slowly changing magnetic field, changes the shape of the magnetic field when it moves, allowing detection of transient changes in the magnetic field. A stationary metal object in a static magnetic field does not create such transient changes in the magnetic field. Embodiments of the present invention exploits that difference to detect moving metal objects in an environment which may include stationary metal objects, or even other moving or vibrating metal objects. Embodiments of the present invention also exploit the fact that static or slowly changing magnetic fields, do not behave like a wave and do not reflect or refract, and can therefore "pass through" metal surfaces with significantly lower attenuation, unlike rapidly changing electro-magnetic fields, like those used by pulse induction, which behave like a wave and are reflected and refracted by metal surfaces. As a result, the use of a static or slowly changing magnetic field may allow the detector to detect a metal object even if it is behind a metal wall or barrier, or in a noisy metallic environment.

As used herein, a "static magnetic field" is one that does not change, or changes slowly over time. Any change which does occur, occurs slow enough that transient changes due to a metal object that is moving through the detection volume, or has been placed inside the detection volume, may be discriminated from all other changes. The magnetic field inside a detection volume may be the Earth's magnetic field, or may be a magnetic field created by suitably positioned permanent or electromagnets.

In other embodiments, the present invention may be adapted for use where the bulk material which may include the metal object is placed into the detection volume but is stationary during the detection process. In such cases, where the metal object alters, or is caused to alter the magnetic field in the detection volume, the alteration of the magnetic field may be detected. For example, a "snapshot" of the magnetic field prior to bulk material being placed in the detection volume may be compared to the magnetic field after the bulk material is placed. Any alterations to the magnetic field may be detected and may be attributed to a metal object being present.

In general terms, one embodiment of the present invention comprises a system comprising at least one sensor adapted to detect a change in strength and/or direction of a magnetic field and output a signal which may comprise noise and a detection signal, and a signal processing system adapted to derive the detection signal from the output signal. The signal processing system may use various techniques to detect or amplify the detection signal from noise caused by the system environment, or to cancel or suppress the noise. All metal objects in the vicinity of the sensor will contribute to the signal which is detected by the sensor. However, stationary metal objects will not cause the same shift in the magnetic field as does a moving metal object. Accordingly, in one embodiment, the system relies on that difference to detect and discriminate a metal object that is moving through the detection volume.

Preferably, the system comprises a plurality of sensors arrayed adjacent to a detection volume. Preferably, the plurality of sensors are arrayed in different locations around the detection volume so as to increase the detectability of metal objects in the detection volume. In one embodiment, at least one noise sensor is provided which is positioned to detect a noise signal, which is then used by the signal processing system in a noise-cancelling algorithm to derive the detection signal. In one embodiment, the noise sensor may comprise a vibration sensor, such as an accelerometer, which is positioned close to a vibrational source of signal noise.

In one embodiment, the system is adapted to be used with a moving conveyor belt (B) in a detection volume (V), shown schematically in FIG. 1. The conveyor belt continuously moves bulk material through the detection volume. A first sensor (10) is positioned on one side of the belt (B). If a metal piece is conveyed by the belt (B) past the sensor (10), the sensor will detect an alteration in the magnetic field. The sensor output signal will include a noise caused by vibration or rotation of metal components in the conveyor belt rollers (R). Therefore, the signal generated by the sensor (10) may be processed to increase the sensitivity to a relevant signal. For example, components of the signal which may be attributed to rotating metal components may have frequency characteristics that permit effective filtering in the frequency domain.

A second sensor (20) positioned opposite the first sensor (10) may provide increased sensitivity by providing a second signal which may be summed with the signal from the first sensor. In one embodiment, a plurality of sensors may provide even greater sensitivity. If another sensor (30) is placed downstream from the first sensor, as shown schematically in FIG. 1, then the signal may represent a time-shifted signal, which again may be combined with the first sensor signal to provide increased sensitivity. A fourth sensor (40) may be summed with the signal from the third sensor (30) in like manner.

Figure 2:
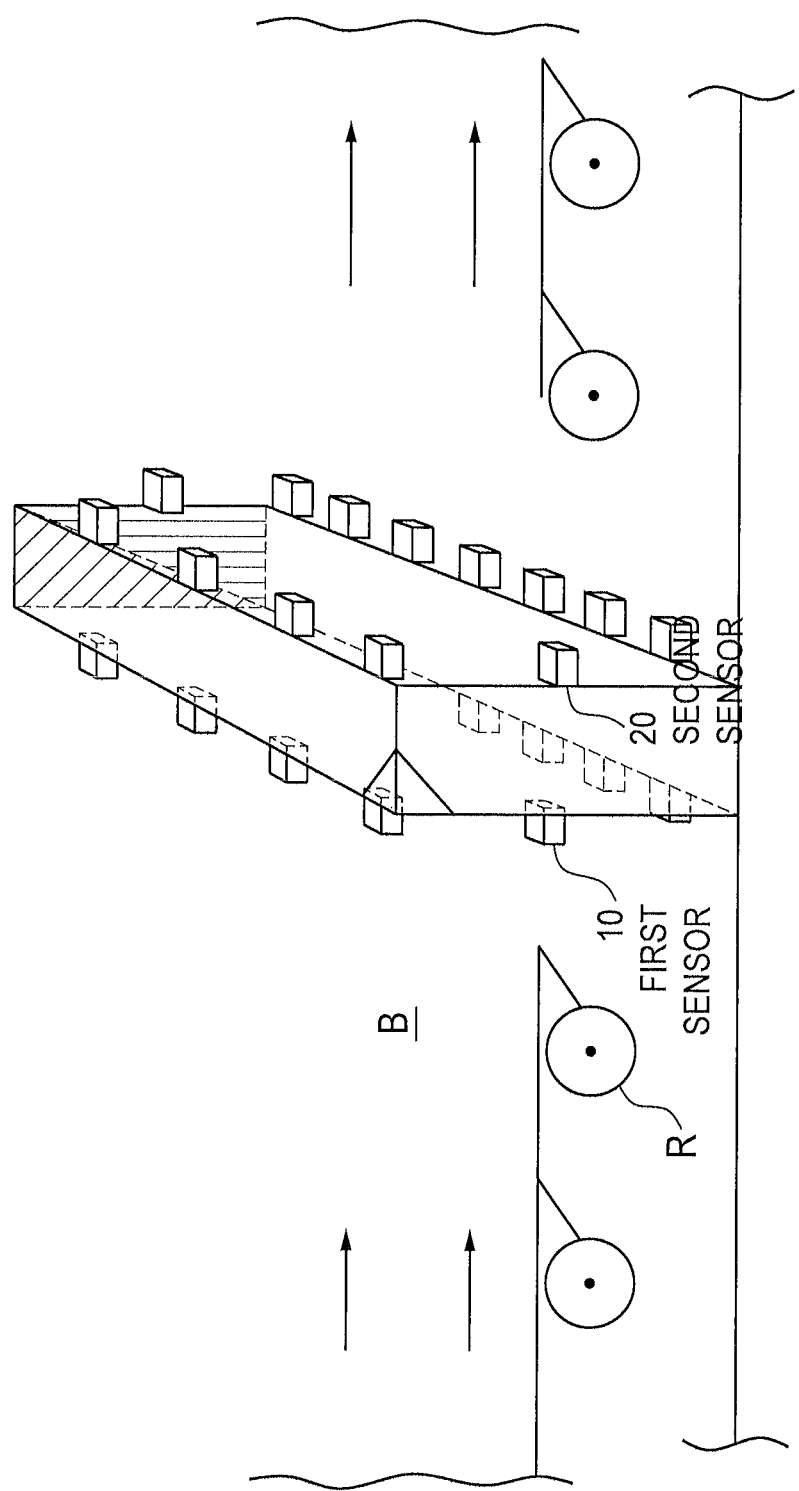
FIG. 2 is a schematic pictorial representation of one embodiment of the present invention.

In one embodiment, a plurality of sensors (10, 20) positioned besides, above and/or below the conveyor belt, as shown in FIG. 2, may provide signals which may be suitably combined and filtered by the signal processing system.

Figure 3:
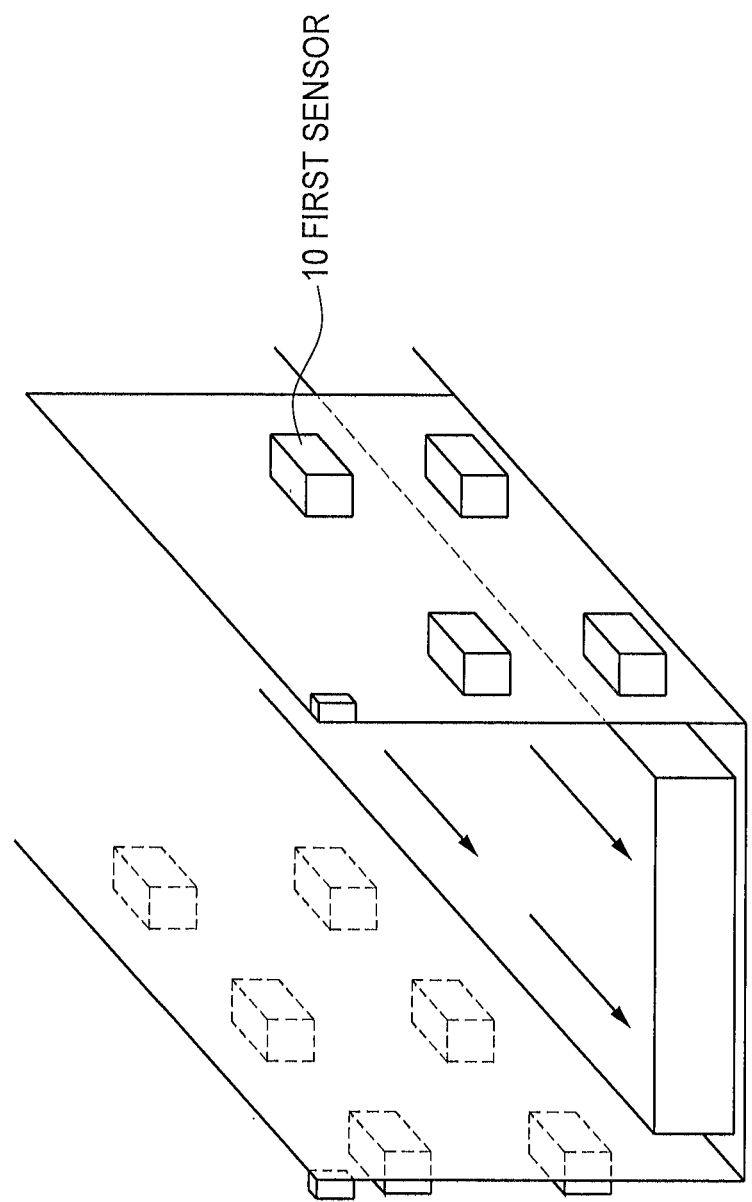
FIG. 3 is a schematic pictorial representation of another embodiment, implemented with a metal apron feeder.

In another embodiment, the system may be adapted to detect moving metal in a stationary metal environment, such as an apron feeder (A) where the bulk material flows or slides down a metal slide or chute, as shown in FIG. 3. As noted above, stationary metal objects do not cause a change in a static magnetic field, but a moving metal object does.

Thus, the sensors (10) may detect a signal representative of a moving metal object by detecting a change in a magnetic field. Additionally, because the system relies on a static magnetic field in the detection volume, the sensors may be placed outside a metal wall.

Figure 4:
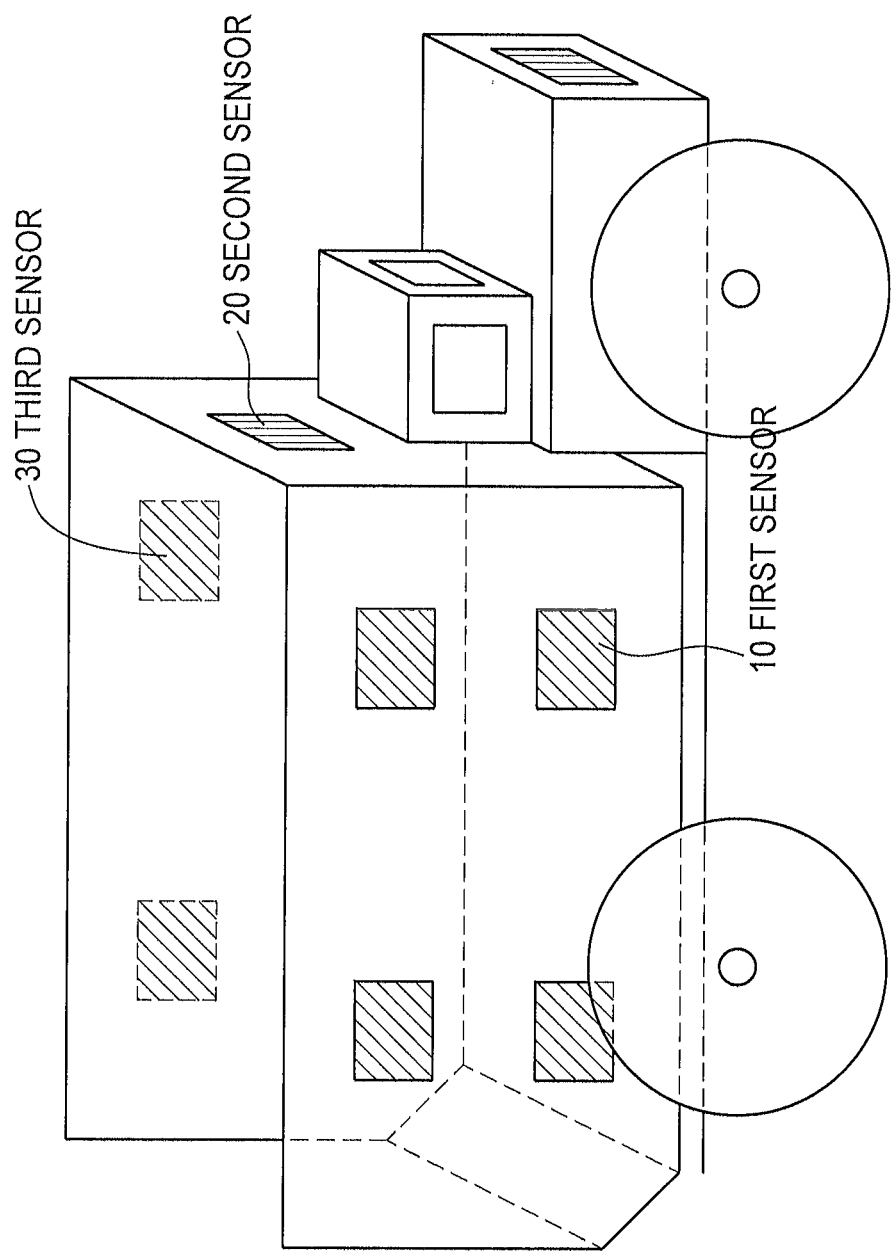
FIG. 4 is a schematic pictorial representation of another embodiment, implemented in a truck bed.

In another embodiment, the system may be adapted for use in a truck bed, as shown schematically in FIG. 4. The bulk material which may contain a metal object in a truck bed is not moving, but is placed in the truck bed as a batch. The detection volume in this case is the volume of the truck bed. In this case, the system may not detect a transient alteration in the magnetic field, but rather, the system may detect differences in the magnetic field by comparing "before" and "after" measurements of the magnetic field in the detection volume. Despite the metal walls of the truck bed, a metal object may create enough of an alteration in the magnetic field that it may be detectable by the sensor system. The noise components of the signal attributable to the environment will be the same in both "before" and "after" measurements, and may therefore be cancelled out.

Figure 5:
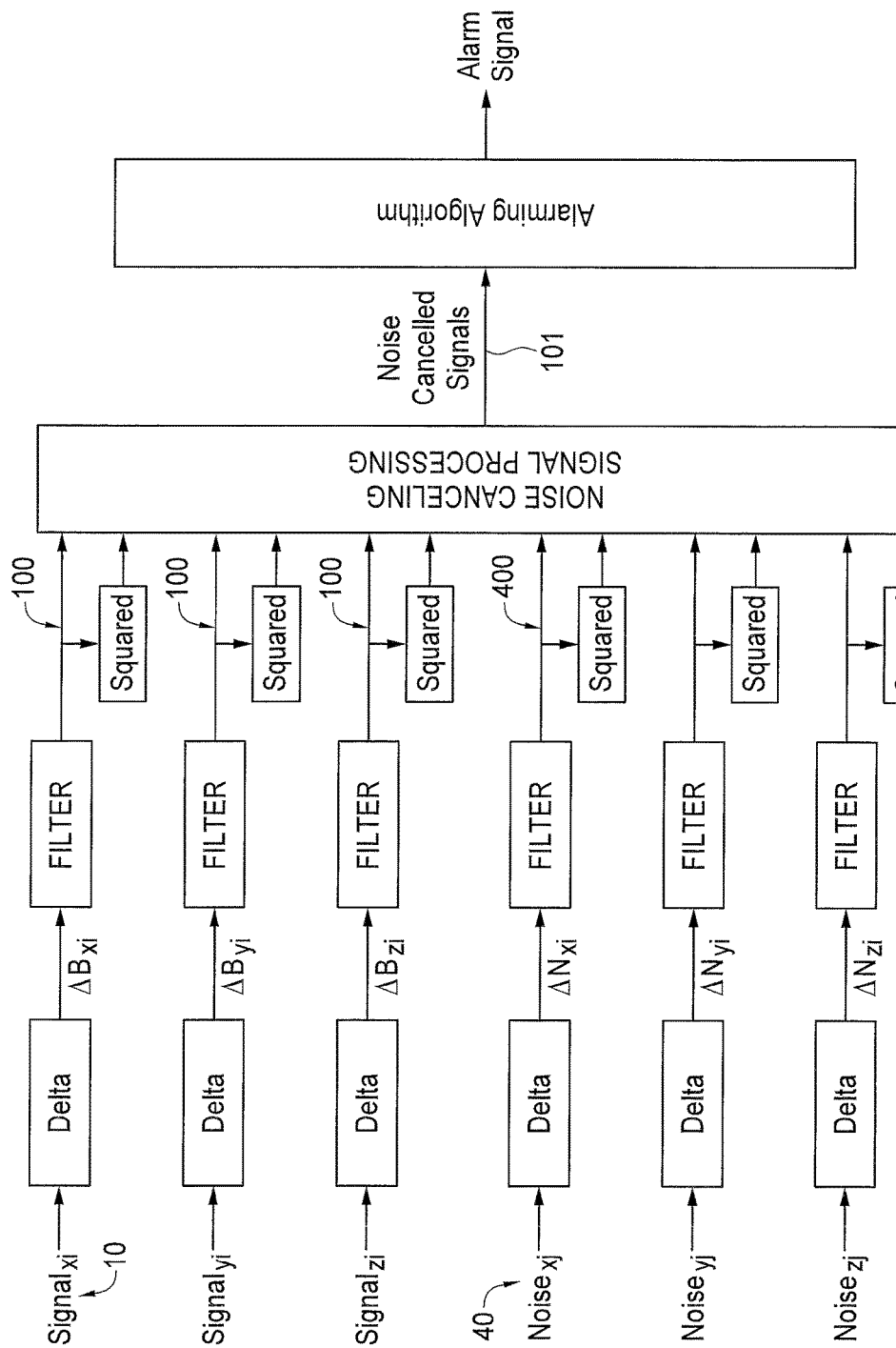
FIG. 5 is a schematic representation of one embodiment of a signal processing scheme of the present invention

The signals produced by the sensors in a system of the present invention may be processed using standard digital or analog magnetic anomaly signal processing techniques. In one embodiment, shown schematically in FIG. 5, a sensor (10) comprises a three-axis magnetometer, which is sensitive to a magnetic field in axes x, y and z. The sensor produces signals $\Delta x$, $\Delta y$, and $\Delta z$, which are each filtered and summed to produce output signal (100). Alternatively, or in addition, the output signal itself (100) may be filtered. Alternatively, or in addition, the signal may be detrended and decomposed into orthonormal basis functions (e.g. Wronskian) where the signal can be represented as a coefficients of basis functions. These coefficients can then be used for detection and discrimination in methods such as, for example, Generalized Likelihood Ratio Test. Many other magnetic anomaly detection methods have been developed including the High Order Crossing Method, the Entropy Filter method, Partial Least Squares, and Principal Components Analysis. Such methods are well known to those skilled in the art and described in the prior art. As described above, a system may comprise a plurality of sensors, wherein each of the output signals for each sensor may be combined.

The signal processing system preferably incorporates detection and discrimination algorithms sensitive enough to discriminate metal objects based on size, as smaller metal objects may not be objectionable and may be allowed to pass to the next stage of processing. Accordingly, the detection step may comprise a step of discriminating a detected metal object to determine its size.

A suitable signal processing system may be a digital signal processor, which may be implemented as software operated by a computer, as is well known in the art. Alternatively, as will be appreciated by one skilled in the art, the signal processing system may be implemented in an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

In one embodiment, a noise sensor (40) is positioned adjacent a source of signal noise, preferably closer to the noise source than the main sensors (10). The noise sensor is preferably a three-axis magnetometer like the main sensors. The noise sensor produces an output (400) which is used in a noise cancelling algorithm to produce a more useful signal (101) from the main sensors. In one embodiment, the noise sensor may comprise a vibration sensor, such as an accelerometer, which is positioned close to a vibrational source of signal noise.

If the detection signal (noise-cancelled output signal) (101) matches user-defined criteria which indicate a metal object moved through the detection volume, or is present in the detection volume, then an alarm or notification system may be triggered. The alarm system may provide alarms, such as tactile, visual or audible alarms, and/or may send electronic messages and/or automated phone calls to appropriate personnel. In one embodiment, the alarm system may automatically stop or slow the conveyor belt, or restrict or close an apron feeder, as the case may be.

In one embodiment, three-axis magnetometers which are sensitive enough to measure changes in the Earth's magnetic field are commercially available. In another embodiment, a stronger static magnetic field may be generated in the detection volume, by suitably positioning magnets, such as permanent magnets or electromagnets, for example.

In another embodiment, the bulk non-metallic material may be subjected to a magnetic field upstream of the sensor system in order to magnetize any metal objects which may be present in the bulk material. In an alternative embodiment, a batch of bulk material may be passed through a magnetic field prior to be deposited in a detection volume, such as a truck bed. A magnetized object, even if very slightly magnetized, may provide an enhanced signal in the sensor system. Thus, in one embodiment, permanent magnets may be positioned in close proximity to the moving stream of material, upstream of the sensor system.

DEFINITIONS AND INTERPRETATION

The description of the present invention has been presented for purposes of illustration and description, but it is not intended to be exhaustive or limited to the invention in the form disclosed. Many modifications and variations will be apparent to those of ordinary skill in the art without departing from the scope and spirit of the invention. Embodiments were chosen and described in order to best explain the principles of the invention and the practical application, and to enable others of ordinary skill in the art to understand the invention for various embodiments with various modifications as are suited to the particular use contemplated.

The corresponding structures, materials, acts, and equivalents of all means or steps plus function elements in the claims appended to this specification are intended to include any structure, material, or act for performing the function in combination with other claimed elements as specifically claimed.

References in the specification to "one embodiment", "an embodiment", etc., indicate that the embodiment described may include a particular aspect, feature, structure, or characteristic, but not every embodiment necessarily includes that aspect, feature, structure, or characteristic. Moreover, such phrases may, but do not necessarily, refer to the same embodiment referred to in other portions of the specification. Further, when a particular aspect, feature, structure, or characteristic is described in connection with an embodiment, it is within the knowledge of one skilled in the art to affect or connect such aspect, feature, structure, or characteristic with other embodiments, whether or not explicitly described. In other words, any element or feature may be combined with any other element or feature in different embodiments, unless there is an obvious or inherent incompatibility between the two, or it is specifically excluded.

It is further noted that the claims may be drafted to exclude any optional element. As such, this statement is intended to serve as antecedent basis for the use of exclusive terminology, such as "solely," "only," and the like, in connection with the recitation of claim elements or use of a "negative" limitation. The terms "preferably," "preferred," "prefer," "optionally," "may," and similar terms are used to indicate that an item, condition or step being referred to is an optional (not required) feature of the invention.

The singular forms "a," "an," and "the" include the plural reference unless the context clearly dictates otherwise. The term "and/or" means any one of the items, any combination of the items, or all of the items with which this term is associated. The phrase "one or more" is readily understood by one of skill in the art, particularly when read in context of its usage.

As will also be understood by one skilled in the art, all language such as "up to", "at least", "greater than", "less than", "more than", "or more", and the like, include the number recited and such terms refer to ranges that can be subsequently broken down into sub-ranges as discussed above. In the same manner, all ratios recited herein also include all sub-ratios falling within the broader ratio.

The term "about" can refer to a variation of ±5%, ±10%, ±20%, or ±25% of the value specified. For example, "about 50" percent can in some embodiments carry a variation from 45 to 55 percent. For integer ranges, the term "about" can include one or two integers greater than and/or less than a recited integer at each end of the range. Unless indicated otherwise herein, the term "about" is intended to include values and ranges proximate to the recited range that are equivalent in terms of the functionality of the composition, or the embodiment.

What is claimed is:

1. A system for detecting and discriminating a metal object contained in a bulk of non-metallic material, which is moving or is introduced into a detection volume, comprising:
   (a) at least one triple-axis magnetometer comprised of three magnetometers arrayed in orthogonal planes disposed adjacent the detection volume and adapted to detect a change in strength and/or direction of a static magnetic field and output a signal; and
   (b) a signal processing system adapted to detect a signal representative of the metal object by removing noise components of the output signal.

2. The system of claim 1 comprising a plurality of triple-axis magnetometers, wherein the signal processing system uses the output signals of each of the triple-axis magnetometers.

3. The system of claim 2 wherein the bulk of non-metallic material is a moving stream through the detection volume.

4. The system of claim 3 wherein the moving stream is being conveyed on a conveyor belt or sliding on an apron feeder.

5. The system of claim 2 wherein the plurality of triple-axis magnetometers are disposed adjacent to a detection volume which comprises a metal containment wall.

6. The system of claim 5 wherein the metal containment wall comprises a shovel of a power shovel, a holding tank, can, barrel, or truck box.

7. The system of claim 1 further comprising a noise sensor, positioned in close proximity to a source of signal noise, which outputs a noise signal, wherein the signal processing system subtracts the noise signal from the at least one triple-axis magnetometer output signal.

8. The system of claim 7 wherein the noise sensor is a triple-axis magnetometer or a vibration sensor.

9. The system of claim 3 wherein a first set of triple-axis magnetometers is positioned upstream from a second set of triple-axis magnetometers, wherein the output of each of the triple-axis magnetometers of the first set are combined to produce a first combined output and the output of each of the triple-axis magnetometers of the second set are combined to produce a second combined output, and the first combined output and the second combined output are time-shifted from each other.

10. A method of detecting a metal object in a bulk of non-metallic material in a detection volume, comprising the step of positioning a first triple-axis magnetometer comprised of three magnetometers arrayed in orthogonal planes and adapted to detect a change in a static magnetic field in the detection volume containing the bulk material, detecting a change in the magnetic field caused by the metal object moving through or the introduction of the metal object into the detection volume, and outputting a first signal comprising a detection signal representative of the metal object.

11. The method of claim 10 wherein the detection step further comprises the step of discriminating the metal object based on size.

12. The method of claim 10 comprising a further step of positioning a noise sensor adjacent a source of noise, which outputs a noise signal, and subtracting the noise signal from the output of the first triple-axis magnetometer.

13. The method of claim 10 comprising a step of providing at least one additional triple-axis magnetometers comprised of three magnetometers arrayed in orthogonal planes, each additional triple-axis magnetometer outputting a signal and summing at least a portion of the output signals to detect the detection signal.

14. The method of claim 10 wherein the bulk non-metallic material is moving through the detection volume.

15. The method of claim 14 comprising the step of positioning a second triple-axis magnetometer comprised of three magnetometers arrayed in orthogonal planes and adapted to detect a change in a static magnetic field in the detection volume containing the bulk material and output a second signal, downstream from the first triple-axis magnetometer, whereby the second signal is time-shifted from the first signal.

16. The method of claim 10 wherein the bulk non-metallic material is placed into the detection volume.

17. A system for detecting and discriminating a metal object contained in a bulk of non-metallic material, which is moving or is introduced into a detection volume, comprising:
   (a) at least one triple-axis magnetometer disposed adjacent the detection volume and adapted to detect a change in strength or direction of a static magnetic field, or both strength and direction of the magnetic field, and output a signal;
   (b) a signal processing system adapted to detect a signal representative of the metal object by removing noise components of the output signal; and
   (c) a noise sensor, positioned in close proximity to a source of signal noise which outputs a noise signal, wherein the signal processing system subtracts the noise signal from the magnetometer output signal.

18. The system of claim 17 comprising a plurality of triple-axis magnetometers, wherein the signal processing system uses the output signals of each of the magnetometers.

19. The system of claim 18 wherein the bulk of non-metallic material is a moving stream through the detection volume.

20. The system of claim 19 wherein the moving stream is being conveyed on a conveyor belt or sliding on an apron feeder.

21. The system of claim 18 wherein the plurality of magnetometers are disposed adjacent to the detection volume which comprises a metal containment wall.

22. The system of claim 21 wherein the metal containment wall comprises a shovel of a power shovel, a holding tank, can, barrel, or truck bed.

23. The system of claim 17 wherein the noise sensor is a triple-axis magnetometer or a vibration sensor.

24. The system of claim 19 wherein a first set of magnetometers is positioned upstream from a second set of magnetometers, wherein the output of each of the magnetometers of the first set is combined to produce a first combined output and the output of each of the magnetometers of the second set is combined to produce a second combined output are compared to provide time-shifted output signals.

25. A method of detecting a metal object in a bulk of non-metallic material in a detection volume, comprising the steps of positioning a first triple-axis magnetometer adapted to detect a change in a static magnetic field in the detection volume containing the bulk material, detecting a change in the magnetic field caused by the metal object moving through or the introduction of the metal object into the detection volume, outputting a first output signal comprising a detection signal representative of the metal object, and positioning a noise sensor adjacent a source of noise, which outputs a noise signal, and subtracting the noise signal from the first output signal.

26. The method of claim 25 wherein the detection step further comprises a step of discriminating the metal object based on size.

27. The method of claim 25 comprising a step of providing at least one additional triple-axis magnetometer, each magnetometer outputting an output signal and summing at least a portion of the output signals to detect the detection signal.

28. The method of claim 25 wherein the bulk non-metallic material is moving through the detection volume.

29. The method of claim 28 comprising a step of positioning a second triple-axis magnetometer downstream from the first triple-axis magnetometer, which second magnetometer outputs a second output signal which is time-shifted from the first output signal.

30. The method of claim 25 wherein the bulk non-metallic material is placed into the detection volume.

* * * * *